United States Patent [19]
Pedersen

[11] Patent Number: 5,872,463
[45] Date of Patent: Feb. 16, 1999

[54] ROUTING IN PROGRAMMABLE LOGIC DEVICES USING SHARED DISTRIBUTED PROGRAMMABLE LOGIC CONNECTORS

[75] Inventor: Bruce B. Pedersen, San Jose, Calif.

[73] Assignee: Altera Corporation, San Jose, Calif.

[21] Appl. No.: 710,862

[22] Filed: Sep. 23, 1996

Related U.S. Application Data

[60] Provisional application No. 60/014,824 Apr. 4, 1996.
[51] Int. Cl.[6] .......................... H03K 19/177; H03K 7/38
[52] U.S. Cl. ................................. 326/41; 326/39
[58] Field of Search ........................ 326/39, 41

[56] References Cited

U.S. PATENT DOCUMENTS

| | | | |
|---|---|---|---|
| Re. 34,363 | 8/1993 | Freeman | 307/465 |
| 3,473,160 | 10/1969 | Wahlstrom | 340/172.5 |
| 4,609,986 | 9/1986 | Hartmann et al. | 364/200 |
| 4,617,479 | 10/1986 | Hartmann et al. | |
| 4,642,487 | 2/1987 | Carter | |
| 4,677,318 | 6/1987 | Veenstra | |
| 4,713,792 | 12/1987 | Hartmann et al. | 364/900 |
| 4,758,745 | 7/1988 | Elgamal et al. | |
| 4,774,421 | 9/1988 | Hartmann et al. | |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 5,023,606 | 6/1991 | Kaplinsky | 340/825.8 |
| 5,121,006 | 6/1992 | Pedersen | 307/465 |
| 5,144,166 | 9/1992 | Camarota et al. | 307/465.1 |
| 5,208,491 | 5/1993 | Ebeling et al. | 307/465 |
| 5,220,214 | 6/1993 | Pedersen | 307/465 |
| 5,241,224 | 8/1993 | Pedersen et al. | 307/465 |
| 5,258,668 | 11/1993 | Cliff et al. | 307/465 |
| 5,260,610 | 11/1993 | Pedersen et al. | 307/465 |
| 5,260,611 | 11/1993 | Cliff et al. | 307/465 |
| 5,274,581 | 12/1993 | Cliff et al. | 364/784 |
| 5,350,954 | 9/1994 | Patel | 307/465 |
| 5,371,422 | 12/1994 | Patel et al. | 326/41 |
| 5,448,186 | 9/1995 | Kawata | 326/41 |
| 5,483,178 | 1/1996 | Costello et al. | 326/41 |
| 5,543,732 | 8/1996 | McClintock et al. | 326/41 |
| 5,689,195 | 11/1997 | Cliff et al. | 326/41 |
| 5,694,058 | 12/1997 | Reddy et al. | 326/41 |
| 5,764,080 | 6/1998 | Huang et al. | 326/41 |

FOREIGN PATENT DOCUMENTS

| | | | |
|---|---|---|---|
| 630115 A | 6/1994 | European Pat. Off. | H03K 19/173 |
| 2300953 | 5/1996 | United Kingdom | H03K 19/177 |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

*Recent Developments in Switching Theory*, A. Mukhopadhyay, ed., Academic Press, New York, 1971, chapters VI and IX, pp. 229–254 and 369–422.

El Gamal et al., "An Architecture for Electrically Configurable Gate Arrays," IEEE Journal of Solid–State Circuits, vol. 24, No. 2, Apr. 1989, pp. 398–398.

El–Ayat et al., "A CMOS Electrically Configurable Gate Array," IEEE Journal of Solid–State Circuits, vol. 24, No. 3, Jun. 1989, pp. 752–762.

"XC5000 Logic Cell Array Family, Technical Data, Advance Information," Xilinx, Inc., Feb. 1995.

*Primary Examiner*—Michael J. Tokar
*Assistant Examiner*—Richard Roseen
*Attorney, Agent, or Firm*—Fish & Neave; Robert R. Jackson

[57] ABSTRACT

The output signals of the logic regions in a programmable logic integrated circuit device are programmably connectable to output bus conductors. Each such output signal can be applied to any of several of these conductors, and each conductor can receive any of several output signals. Each output bus conductor is connectable to one or more output drivers (e.g., through a programmable connector it shares with another output bus conductor). The output drivers can drive more general interconnection resources of the device. This device architecture increases logic region output signal routing flexibility and/or allows the number of output drivers to be decreased (i.e., by making more efficient use of the output drivers that are provided).

33 Claims, 2 Drawing Sheets

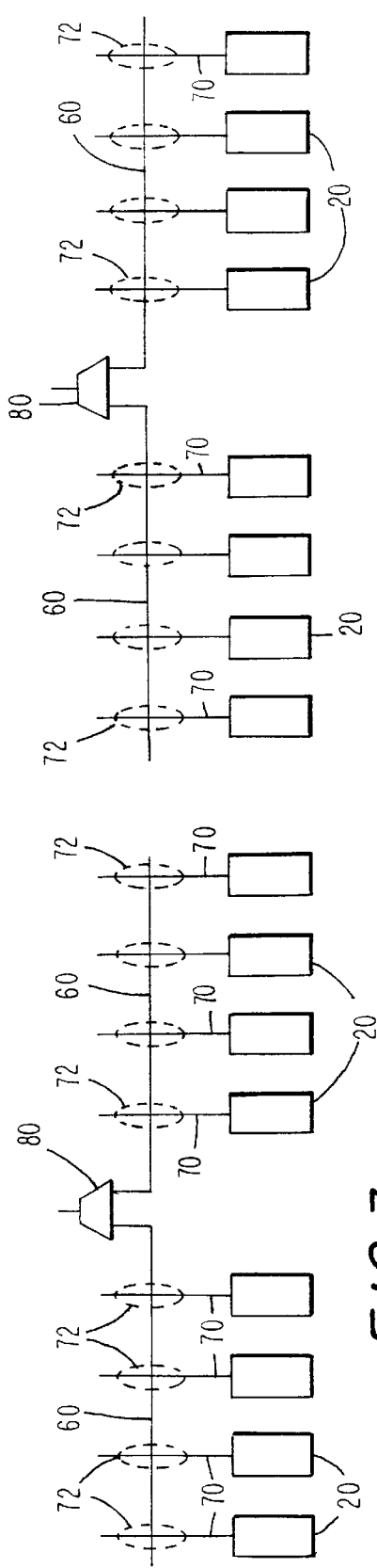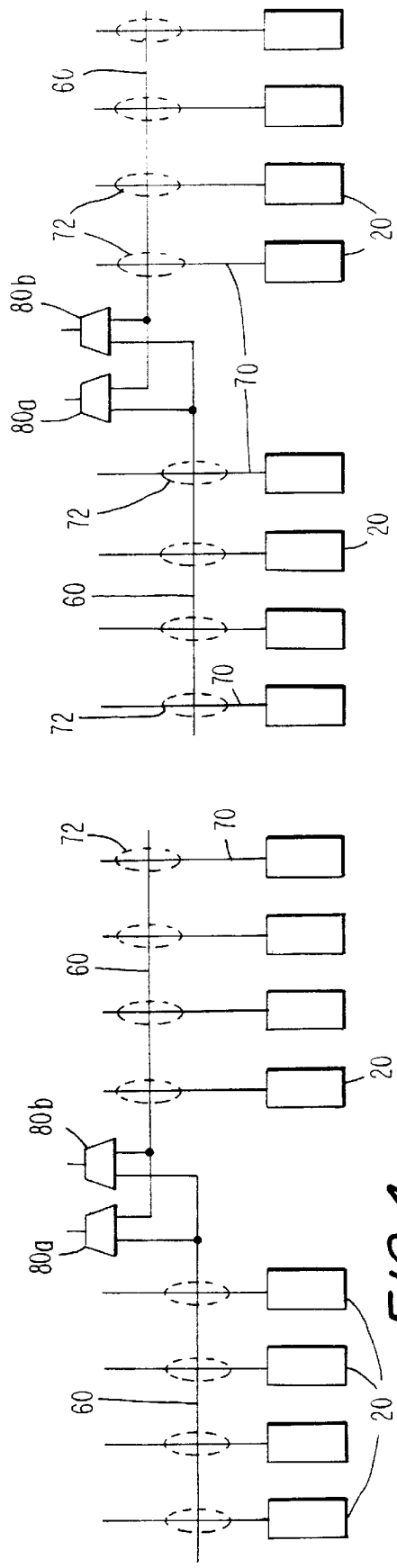
FIG. 3
FIG. 4

ROUTING IN PROGRAMMABLE LOGIC DEVICES USING SHARED DISTRIBUTED PROGRAMMABLE LOGIC CONNECTORS

This application claims the benefit of U.S. provisional application No. 60/014,824, filed Apr. 4, 1996.

BACKGROUND OF THE INVENTION

This invention relates to programmable logic integrated circuit devices, and more particularly to the signal routing resources in such devices.

Programmable logic integrated circuit devices are well known as is shown, for example, by Pedersen et al. U.S. Pat. No. 5,260,610 and Cliff et al. U.S. Pat. No. 5,260,611, both of which are hereby incorporated by reference herein. Such devices typically include a large number of regions of programmable logic. Each logic region is programmable to produce an output signal which is any one of a number of relatively elementary logic functions of several input signals applied to the logic region. The logic regions are typically disposed on the device in a plurality of intersecting rows and columns of such regions. Interconnection conductors are provided along the rows and columns for conveying signals to, from, and between the logic regions. For example, horizontal conductors may be associated with each row of regions for conveying signals along the associated row. Vertical conductors may be associated with each column of regions for conveying signals along the associated column. Programmable logic connectors ("PLCs") are provided for programmably connecting (1) selected adjacent interconnection conductors to the inputs of each logic region, (2) the output of each logic region to selected interconnection conductors adjacent to the logic region, and (3) selected interconnection conductors to one another (e.g., connecting selected horizontal conductors to selected vertical conductors). In this way any number of the logic regions can be concatenated to perform very complex logic functions.

Because of the large number of logic regions provided in a typical programmable logic device, it is not practical or economical to provide completely universal interconnection conductor resources on the device. Such universal resources would allow any interconnection to be made to, from, or between logic regions regardless of what other interconnections had been made. An excessive fraction of the overall resources of the device would have to be devoted to interconnection resources if such complete universality were provided, and large amounts of such universal resources would be unused in most (if not substantially all) cases. It is therefore important to devise less than completely general interconnection structures that are highly efficient (in the sense that they take up a significantly-reduced fraction of the overall resources of the device) but still afford a high degree of interconnectivity and signal routing flexibility. Because programmable logic devices are general-purpose devices, it is desirable to construct them so that they have the widest possible applicability (consistent with other objectives such as desired size, speed, power consumption, cost, etc.). Efficient interconnection structures are very important to achieving all of these objectives.

Among the important components of typical programmable logic device interconnection structures are driver circuits. Such driver circuits may be used to apply the output signal of each logic region to the horizontal and/or vertical interconnection conductors associated with that region. A driver circuit is needed to make sure that the logic region output signal is strong enough to drive the conductor to which it is applied, as well as the further circuitry that receives the signal from that conductor. The necessary driver circuits therefore tend to be relatively large and power-consuming. They may also need to be programmable and/or tri-statable, and to therefore be accompanied by auxiliary circuitry such as programmable memory cells. It is accordingly desirable to try to reduce the required number of driver circuits and/or to make better use of the driver circuits that are provided.

In view of the foregoing, it is an object of this invention to provide improved programmable logic devices.

It is a more particular object of this invention to provide improved interconnection resource structures for programmable logic devices.

It is a still more particular object of this invention to make better use of the driver circuits that are provided in the interconnection resources of programmable logic circuits, possibly allowing the number of such circuits to be reduced without sacrificing signal routing flexibility and/or allowing increased signal routing flexibility with a given number of driver circuits.

SUMMARY OF THE INVENTION

These and other objects of the invention are accomplished in accordance with the principles of the invention by providing programmable logic devices in which the logic regions are grouped in a plurality of groups of plural logic regions, and each such group is served by a plurality of output bus conductors. The output signal of each logic region in a group is programmably connectable to each of a subplurality of the associated output bus conductors. Other interconnection conductors adjacent each group (e.g., vertical conductors) may also be programmably connectable to feed the output bus conductors associated with that group. Each output bus conductor associated with a group is paired with an output bus conductor in at least one adjacent group. A programmable logic connector ("PLC") allows the signal on either of the output bus conductors in each such pair to be applied to one or more output drivers associated with that pair. For example, one output driver may be used to drive an adjacent horizontal interconnection conductor, and another driver may be used to drive an adjacent vertical interconnection conductor. The output drivers may be programmable and/or tri-statable.

By allowing the output signal of each logic region to be programmably connectable to any of several of the associated output bus conductors, each logic region output signal is given more ways to get out to the horizontal and vertical interconnection conductors without increasing the required number of output driver circuits. Signal routing flexibility is thereby increased without the need for more output drivers. Indeed, by effectively sharing a pool of output drivers among the logic regions in a group—and furthermore between at least two groups (by virtue of the immediately above-mentioned PLCs)—the required number of output drivers may actually be reduced with no loss of signal routing flexibility, or even concurrent with an increase in signal routing flexibility.

Each output bus conductor in a group may be paired in the manner described above with an output bus conductor in each of two other groups (e.g., the groups to the left and right of the first-mentioned group). This gives each output bus conductor more ways out to the horizontal and vertical conductors because each output bus conductor can then use the PLC and output drivers associated with either of its pairing relationships to get out to the horizontal and vertical conductors.

Each logic region may be a member of several different groups, each of the groups to which a logic region belongs spanning different subsets of the logic regions. Each of the groups to which a logic region belongs may have all of the associated circuitry that is described above (i.e., output bus conductors, PLCs, and output drivers). This further increases output signal routing flexibility and reduces the potential for output signal blocking.

If preferred, the output bus conductors in a group may be paired with the output bus conductors in only one other group. Particularly in a case of this kind, each pair of output bus conductors may have more than one PLC and associated output drivers to increase the signal routing flexibility of the output bus conductors in each pair.

If desired, the output bus conductors in each group may programmably feed the inputs to the logic regions in the group. This feature can be used to apply the outputs of logic regions in the group to the inputs of logic regions in the group without needing to user longer-distance interconnection conductors to make these relatively short-distance interconnections.

Further features of the invention, its nature, and various advantages will be more apparent from the accompanying drawings and the following detailed description of the preferred embodiments

BRIEF DESCRIPTION OF THE DRAWINGS

FIG. 3 is a simplified schematic block diagram of a representative portion of another alternative illustrative embodiment of the invention.

FIG. 4 is a simplified schematic block diagram of yet another alternative illustrative embodiment of the invention.

DETAILED DESCRIPTION OF THE PREFERRED EMBODIMENTS

Figure 1:
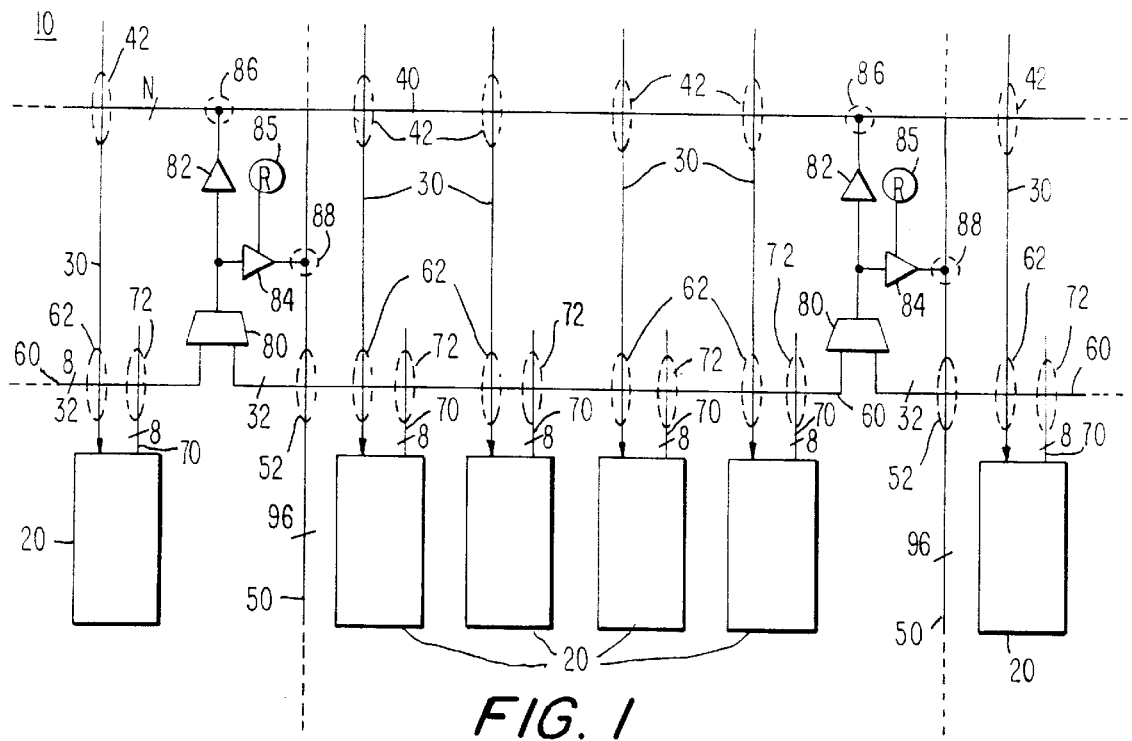
FIG. 1 is a simplified schematic block diagram of a representative portion an illustrative programmable logic integrated circuit device constructed in accordance with this invention.

A representative portion of an illustrative programmable logic integrated circuit device 10 constructed in accordance with this invention is shown in FIG. 1. The circuitry shown in FIG. 1 may be a modification of programmable logic device circuitry of the type shown, for example, in Cliff et al. U.S. Pat. No. 5,260,611 or Cliff et al. U.S. Pat. No. 5,689,195, both of which are hereby incorporated by reference herein. It will be understood that these possible contexts for the improvements described herein are only illustrative, and that the invention can be used in any other suitable programmable logic device context. Also, the various parameter values mentioned herein (e.g., the numbers of various types of components, conductors, programmable connections, etc.) are only exemplary, and these parameters may have any other desired values. The same is true for such directional or orientational parameters as "horizontal"/ "vertical", "row"/"column", "up"/"down", "left"/"right", etc. These terms can be interchanged if desired.

In the illustrative embodiment shown in FIG. 1 six representative logic array blocks ("LABs") 20 in one representative row of the device are depicted. Each LAB 20 includes eight logic modules (not shown separately in FIG. 1). Each logic module receives four input signals and is programmable to provide an output signal which is any of several logic functions of the input signals. For example, each logic module may include a four-input look-up table which can be programmed to provide any logical combination of the four inputs. The term "logic region" as used herein may refer to either an individual logic module, or to a LAB 20.

Each LAB 20 has a plurality of block feeding conductors 30 that supply input signals to the logic modules in that LAB. Each of conductors 30 is programmably connectable to any of a subset of a plurality of horizontal conductors 40 that extend along the row that includes those conductors 30. The programmable connections from conductors 40 to conductors 30 are indicated by the dotted ellipses 42 in FIG. 1. Different subsets of conductors 40 are connectable to various conductors 30 to give good flexibility of signal routing from conductors 40 into LABs 20. In general, conductors 40 are used for relatively long-distance interconnections along the associated row. Interconnections from one row to another are made via vertical conductors 50, which are discussed in more detail below. For present purposes it will be sufficient to point out that there is a plurality of vertical conductors 50 adjacent to each column of four adjacent LABs 20 in each row.

In accordance with the present invention the LABs 20 in each row are grouped into groups of four adjacent LABs. For example, the center four LABs 20 shown in FIG. 1 form one group, the LAB to the left of this group is the first LAB in the next group to the left, and the LAB to the right of the center group is the first LAB in the next group to the right.

Each of the above-described groups of four LABs has an associated plurality of output bus conductors 60. The eight outputs 70 from each LAB 20 (one output from each of the eight logic modules in the LAB) are programmably connectable to the output bus conductors 60 associated with the group of four LABs that includes that LAB. For example, there may be 32 output bus conductors 60 associated with each group of four LABs 20, and each output conductor 70 may be programmably connectable to any of four of these conductors 60. Various ones of conductors 70 are connectable to different ones of conductors 60 to increase signal routing flexibility and decrease the probability of signals blocking one another. The programmable connections from conductors 70 to conductors 60 are indicated by the dotted ellipses 72 in FIG. 1.

Each group of output bus conductors 60 can also receive signals from the vertical conductors 50 that are adjacent to that group of conductors 60. This is shown by the dotted ellipses 52 in FIG. 1. For example, if there are 96 conductors 50 in each group of such conductors, each of these conductors may be programmably connectable to any of three of the associated conductors 60 in each row. These connections from conductors 50 are preferably uniformly distributed over the 32 conductors in each group of conductors 60.

Adjacent each end of each conductor 60 that conductor is connected to one input of a programmable logic connector ("PLC") 80. The other input to each PLC 80 is a conductor 60 from the adjacent group of such conductors. Each PLC 80 is programmable to connect either of its inputs to its output. The output of each PLC is applied to an associated horizontal output driver 82 and to an associated vertical output driver 84. Each output driver 82 applies its output signal to one of adjacent horizontal conductors 40, and each output driver 84 applies its output signal to one of adjacent vertical conductors 50. Output drivers 82 and 84 are relatively strong circuits that are capable of driving relatively long conductors 40 or 50 with their relatively high loading (because of their length and the number of programmable taps to other circuitry that they have). Output drivers 82 and 84 may be programmable (to either operate or not) and/or tristatable (to provide a high impedance output when they are not being used). Programmable memory cells 85 associated with each of output drivers 84 represent this possible programmability of the output drivers. The connections from the output drivers to conductors 40 and/or 50 may also be programmable (as indicated by the dotted circles 86 and 88 in FIG. 1).

It will be understood from the foregoing discussion that each depicted PLC 80 actually represents multiple such devices (32 such devices in the particular embodiment being discussed—one PLC 32 for each pair of conductors 60 that feed such a PLC). Similarly, each depicted output driver 82 and each depicted output driver 84 represents 32 such drivers in the embodiment being discussed. The drivers 82 and 84 in each group of such drivers preferably drive different ones of the adjacent conductors 40 and 50, again for more flexible signal routing and to reduce the probability of signals blocking one another.

The above-described circuitry greatly increases the flexibility with which logic module output signals 70 can be routed into the interconnection circuitry 40 and 50 of the device (as compared to cases in which each logic module has some dedicated output drivers for applying the output signal of that logic module to certain ones of horizontal and/or vertical conductors). For example, in the particular embodiment being discussed, each logic module output signal can get to four conductors 60, and from those four conductors to eight conductors 40 and eight conductors 50 (assuming that the output drivers 82 at each end of each conductor 60 connect to different ones of conductors 40). At the same time that the FIG. 1 circuit provides greater logic module output signal routing flexibility, it does so without increasing the required number of output drivers. Indeed, by allowing any of several logic module output signals 70 to use each output driver 82 or 84, the circuit makes more efficient use of the output drivers, thereby making it possible to reduce the number of such drivers while simultaneously increasing signal routing flexibility. Reducing output driver count is helpful in the design of programmable logic devices because such drivers tend to be relatively large circuit components that consume substantial amounts of power. It will also be noted that the above-described architecture aids routing by allowing a logic module or a vertical conductor 50 to drive multiple horizontal conductors 40, either by feeding onto multiple conductors 60, or by feeding a single conductor 60 which then feeds both its left and right horizontal output drivers 82.

As shown by the dotted ellipses 62 in FIG. 1, conductors 60 may be programmably connectable to feed the block feeding conductors 30 of the associated LABs 20. For example, each conductor 60 may be programmably connectable to two of the conductors 30 in each group of conductors 30 that the conductor 60 intersects. In this way conductors 60 can be used to convey signals between the LABs 20 (or even between logic modules in a LAB) in each group of four such LABs. This avoids having to use conductors 40 for such relatively short-distance connections, which in turn reduces the need for output drivers 82.

Figure 2:
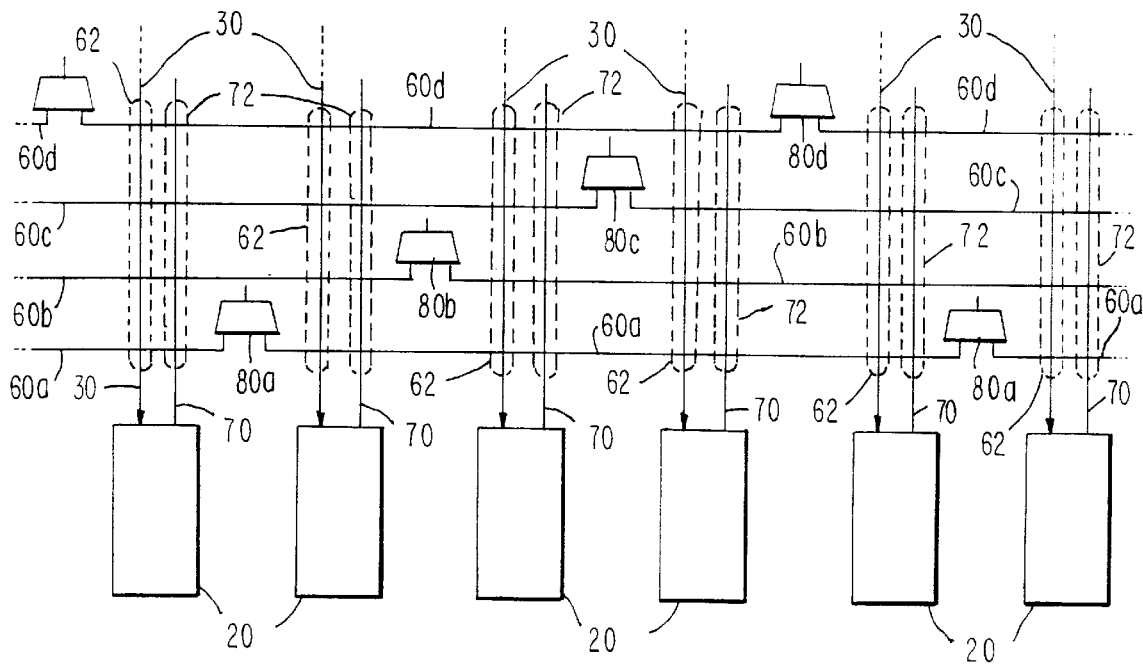
FIG. 2 is a simplified schematic block diagram of a representative portion of an alternative illustrative embodiment of the invention.

In the embodiment shown in FIG. 1, each LAB 20 is a member of only one group of four LABs. The groups are therefore mutually exclusive of one another in FIG. 1. FIG. 2 shows an alternative embodiment in which each LAB 20 is a member of four different groups of four LABs each. Each group of which each LAB 20 is a member has an associated group of output bus conductors 60a, 60b, 60c, and 60d. The conductors in each of these groups are arranged similarly to the conductors 60 in FIG. 1 (although the number of conductors in each group 60a–d may be less than (e.g., one quarter) the number of conductors in each group 60 in FIG. 1). Each conductor 60a–d in each such group is paired with a similar conductor from a similar axially adjacent group to provide the two inputs to a PLC 80a–d associated with that pair of conductors. The output of each PLC 80a–d is applied to associated output drivers (not shown in FIG. 2 but similar to elements 82 and/or 84 in FIG. 1) for driving horizontal and/or vertical conductors like 40 and 50 in FIG. 1.

The embodiment shown in FIG. 2 may facilitate having some vertical conductors 50 adjacent to each column of LABs 20, rather than adjacent to only every fourth LAB 20 as in FIG. 1. The embodiment shown in FIG. 2 may also improve signal routing flexibility and reduce the probability of signals blocking one another by being more homogeneous (or less granular) than the embodiment shown in FIG. 1.

In the further alternative embodiment shown in FIG. 3 each output bus conductor group 60 is paired with only one other such group to provide the inputs to PLCs 80. In other respects the FIG. 3 embodiment may be similar to FIG. 1.

The still further alternative embodiment shown in FIG. 4 is somewhat like the FIG. 3 embodiment in that each conductor group 60 is paired with only one other such group in order to provide inputs to PLCs 80. In the FIG. 4 embodiment, however, each pair of conductors 60 provides the inputs to two PLCs 80a and 80b. Each of PLCs 80a and 80b has associated output drivers similar to output drivers 82 and/or 84 in FIG. 1, and the output connections of each of those drivers of either type are different. Thus each conductor 60 can get out to different horizontal and/or vertical conductors by using either of the PLCs 80a and 80b to which that conductor is connected.

PLCs 80 (and other programmable connections described throughout this specification) can be implemented in any of a wide variety of ways. For example, each PLC can be a relatively simple programmable connector such as a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic implementing functions such as AND, NAND, OR, or NOR. Examples of components suitable for implementing PLCs are EPROMs, EEPROMs, pass transistors, transmission gates, antifuses, laser fuses, metal optional links, etc. The components of PLCs can be controlled by various function control elements ("FCEs") as described in more detail below (although with certain PLC implementations (e.g., fuses and metal optional links) separate FCE devices are not required, so that in those cases the depiction of FCE devices (such as 85) in the accompanying drawings merely indicates that the PLCs are programmable).

FCEs (such as 85 and the programmable elements of the logic modules in LABs 20) can also be implemented in any of several different ways. For example, FCEs 51 can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like.

It will be understood that the foregoing is only illustrative of the principles of the invention, and that various modifications can be made by those skilled in the art without departing from the scope and spirit of the invention. For example, the number of logic modules in a LAB 20 can be more or less than the number assumed above. Similarly, the numbers of each type of conductor can differ from the numbers mentioned. The densities of the populations of the programmable connections between the various type of conductors can also be different from those mentioned above.

The invention claimed is:

1. A programmable logic integrated circuit device comprising:

a plurality of regions of programmable logic, each of which has an output conductor for an output signal of the logic region, said logic regions being grouped in a plurality of groups of plural logic regions;

a plurality of output bus conductors associated with each of said groups;

a plurality of programmable connections associated with each of said output conductors for selectively connecting said output conductor to any of a subplurality of the output bus conductors associated with the group having said output conductor;

a plurality of interconnection conductors for conveying signals between said groups; and an output driver circuit for receiving a signal from each of said output bus conductors and for driving one of said interconnection conductors with a signal indicative of the signal received from said output bus conductor.

2. The device defined in claim 1 wherein each of said output bus conductors is paired with another of said output bus conductors, and wherein said device further comprises:

a programmable logic connector associated with each pair of said output bus conductors for connecting either of the output bus conductors in said pair to said output driver circuit.

3. The device defined in claim 2 wherein the output bus conductors that are paired are associated with different ones of said groups.

4. The device defined in claim 3 wherein each of said output bus conductors is additionally paired with an additional one of said output bus conductors, and wherein said device further comprises:

an additional programmable logic connector associated with each additional pair of output bus conductors for connecting either of the output bus conductors in said additional pair to another output driver circuit which is similar to said output driver circuit.

5. The device defined in claim 4 wherein each output bus conductor and the additional output bus conductor with which that output bus conductor is additionally paired are associated with different ones of said groups.

6. The device defined in claim 1 wherein said programmable connections allow each of said output bus conductors to be connected to any one of a multiplicity of said output conductors of the logic regions in the group associated with said output bus conductor.

7. The device defined in claim 1 wherein each of said logic regions has a plurality of inputs, and wherein said device further comprises:

at least one further programmable connection associated with each of said output bus conductors for selectively applying a signal on said output bus conductor to an input of a logic region in the group associated with said output bus conductor.

8. The device defined in claim 1 further comprising:

at least one additional programmable connection associated with each of said output bus conductors for programmably selectively connecting that output bus conductor to one of said interconnection conductors so that said output bus conductor can receive a signal from said one of said interconnection conductors.

9. The device defined in claim 1 wherein said groups are disposed on said device in a two-dimensional array of intersecting rows and columns of said groups, and where said interconnection conductors comprise:

a plurality of horizontal conductors associated with each of said rows; and a plurality of vertical conductors associated with each of said columns.

10. The device defined in claim 9 wherein said interconnection conductor driven by said output driver circuit is a horizontal conductor associated with the row that includes the group associated with the output bus conductor from which said output driver circuit receives a signal.

11. The device defined in claim 10 further comprising:

an additional output driver circuit for receiving a signal from each of said output bus conductors and for driving one of the vertical conductors associated with the column that includes the group associated with the output bus conductor from which said additional output driver circuit receives a signal.

12. The device defined in claim 1 wherein said output driver circuit is programmable to selectively drive said interconnection conductor.

13. The device defined in claim 1 wherein said output driver circuit is tri-statable.

14. The device defined in claim 1 wherein each of said logic regions is a member of only one of said groups, and wherein said groups are mutually exclusive of one another.

15. The device defined in claim 1 wherein each of said logic regions is a member of a multiplicity of said groups, each of said groups of which each logic region is a member having at least one logic region member that is different from the logic region members of the other groups of which said logic region is a member.

16. The device defined in claim 15 wherein each of said output bus conductors is paired with another of said output bus conductors, and wherein said device further comprises:

a programmable logic connector associated with each pair of said output bus conductors for connecting either of the output bus conductors in said pair to said output driver circuit.

17. The device defined in claim 16 wherein the output bus conductors that are paired are associated with different ones of said groups.

18. The device defined in claim 17 wherein said different ones of said groups include mutually exclusive multiplicities of said logic regions.

19. The device defined in claim 2 further comprising:

a second programmable logic connector associated with each pair of said output bus conductors for producing a connector output signal indicative of a signal on either of said output bus conductors in the associated pair; and a second output driver circuit associated with each of said second programmable logic connectors for driving one of said interconnection conductors with a signal indicative of the connector output signal of the associated second programmable logic connector, the interconnection conductors driven by the output driver circuit and second output driver circuit associated with each pair of said output bus conductors being different from one another.

20. A programmable logic integrated circuit device comprising:

a plurality of regions of programmable logic, each of which has an output conductor for an output signal of the logic region, said logic regions being grouped in a plurality of groups of plural logic regions;

a plurality of output bus conductors associated with each of said groups, each of said output bus conductors being paired with another of said output bus conductors, said output bus conductors that are thus paired being respectively associated with different ones of said groups;

a plurality of programmable connections associated with each of said output conductors for selectively connecting said output conductor to any of a subplurality of the output bus conductors associated with the group having said output conductor;

a programmable logic connector associated with each pair of said output bus conductors for producing a connector output signal indicative of a signal on either of said output bus conductors in the associated pair;

a plurality of interconnection conductors for conveying signals between said groups; and an output driver circuit associated with each of said programmable logic connectors for driving one of said interconnection conductors with a signal indicative of the connector output signal of the associated programmable logic connector.

21. The device defined in claim 20 wherein each of said output bus conductors is paired with each of two others of said output bus conductors.

22. The device defined in claim 20 wherein each of said logic regions is a member of a multiplicity of said groups, each of said groups of which each logic region is a member having at least one logic region member that is different from the logic region members of the other groups of which said logic region is a member.

23. The device defined in claim 21 wherein each of said logic regions is a member of a multiplicity of said groups, each of said groups of which each logic region is a member having at least one logic region member that is different from the logic region members of the other groups of which said logic region is a member.

24. The device defined in claim 20 further comprising:

a second programmable logic connector associated with each pair of said output bus conductors for producing a second connector output signal indicative of a signal on either of said output bus conductors in the associated pair; and a second output driver circuit associated with each of said second programmable logic connectors for driving one of said interconnection conductors with a signal indicative of the second connector output signal of the associated second programmable logic connector, the interconnection conductors driven by the output driver circuit and second output driver circuit associated with each pair of said output bus conductors being different from one another.

25. The device defined in claim 20 wherein said programmable connections allow each of said output bus conductors to be connected to any one of a multiplicity of said output conductors of the logic regions in the group associated with said output bus conductor.

26. The device defined in claim 20 wherein each of said logic regions has a plurality of inputs, and wherein said device further comprises:

at least one further programmable connection associated with each of said output bus conductors for selectively applying a signal on said output bus conductor to an input of a logic region in the group associated with said output bus conductor.

27. The device defined in claim 20 further comprising:

at least one additional programmable connection associated with each of said output bus conductors for programmably selectively connecting that output bus conductor to one of said interconnection conductors so that said output bus conductor can receive a signal from said one of said interconnection conductors.

28. The device defined in claim 20 wherein said groups are disposed on said device in a two-dimensional array of intersecting rows and columns of said groups, and where said interconnection conductors comprise:

a plurality of horizontal conductors associated with each of said rows; and a plurality of vertical conductors associated with each of said columns.

29. The device defined in claim 28 wherein said interconnection conductor driven by said output driver circuit is a horizontal conductor associated with the row that includes the group associated with the output bus conductor from which said output driver circuit receives a signal.

30. The device defined in claim 29 further comprising:

an additional output driver circuit for receiving a signal from each of said output bus conductors and for driving one of the vertical conductors associated with the column that includes the group associated with the output bus conductor from which said additional output driver circuit receives a signal.

31. The device defined in claim 20 wherein said output driver circuit is programmable to selectively drive said interconnection conductor.

32. The device defined in claim 20 wherein said output driver circuit is tri-statable.

33. The device defined in claim 20 wherein each of said logic regions is a member of only one of said groups, and wherein said groups are mutually exclusive of one another.

* * * * *